United States Patent
Lee et al.

(10) Patent No.: US 7,990,044 B2
(45) Date of Patent: Aug. 2, 2011

(54) ELECTRICAL PROCESSING APPARATUS AND METHOD FOR ELECTRICALLY PROCESSING DISPLAY PANEL HAVING ORGANIC LIGHT-EMITTING LAYER

(75) Inventors: Sung-Soo Lee, Suwon-si (KR); Beohm-Rock Choi, Seoul (KR); Kyong-Tae Park, Uljeongbu-si (KR); Young-Rok Song, Yongin-si (KR); Ji-Hye Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 545 days.

(21) Appl. No.: 11/767,700

(22) Filed: Jun. 25, 2007

(65) Prior Publication Data
US 2007/0296878 A1    Dec. 27, 2007

(30) Foreign Application Priority Data
Jun. 27, 2006    (KR) .................. 10-2006-0058174

(51) Int. Cl.
*H01J 9/44* (2006.01)
*H01J 9/00* (2006.01)
*G09G 3/10* (2006.01)
*G09G 3/32* (2006.01)

(52) U.S. Cl. ............. 313/500; 445/5; 445/6; 315/169.2; 345/82

(58) Field of Classification Search .......... 313/501–512; 445/3, 5, 6; 345/76–77; 315/169.2
See application file for complete search history.

(56) References Cited

U.S. PATENT DOCUMENTS
| | | | |
|---|---|---|---|
| 2004/0007987 A1* | 1/2004 | Kim et al. ................. | 315/169.2 |
| 2006/0094321 A1* | 5/2006 | Maeda et al. ............. | 445/6 |
| 2007/0103411 A1* | 5/2007 | Cok et al. ................. | 345/82 |

FOREIGN PATENT DOCUMENTS
| | | |
|---|---|---|
| JP | 2003-323979 | 11/2003 |
| JP | 2003-332063 | 11/2003 |
| JP | 2005-276677 | 10/2005 |

\* cited by examiner

*Primary Examiner* — Anne M Hines
*Assistant Examiner* — Tracie Green
(74) *Attorney, Agent, or Firm* — H.C. Park & Associates, PLC

(57) ABSTRACT

The present invention provides an electrical processing apparatus and method for electrically processing a display panel having an organic light-emitting layer. The method for electrically processing a display panel having an organic light-emitting layer includes dividing a light-emitting region of the display panel into a plurality of regions; and applying a voltage to at least one region of the plurality of regions where an amplitude of the voltage exceeds an amplitude of a driving voltage of the display panel. The electrical processing apparatus includes a display panel comprising an organic light-emitting layer, a light emitting region, and a plurality of regions, the plurality of regions being defined by dividing the light emitting region; a jig for holding the display panel; and a current supplying portion, wherein the current supplying portion supplies a current individually to each of the plurality of regions.

14 Claims, 3 Drawing Sheets

ELECTRICAL PROCESSING APPARATUS AND METHOD FOR ELECTRICALLY PROCESSING DISPLAY PANEL HAVING ORGANIC LIGHT-EMITTING LAYER

CROSS-REFERENCE TO RELATED APPLICATION

This application claims priority from and the benefit of Korean Patent Application No. 10-2006-0058174, filed on Jun. 27, 2006, which is hereby incorporated by reference for all purposes as if fully set forth herein.

BACKGROUND OF THE INVENTION

1. Field of Invention

The present invention relates to an electrical processing apparatus and method for electrically processing a display panel having an organic light-emitting diode (OLED) in which an abrupt reduction of initial luminance may be prevented.

2. Description of the Background

With the development of telecommunication technology, the demand for electronic display devices has increased, resulting in the introduction of various display devices. In order to satisfy the various demands of the information age, electronic display devices are being introduced which provide a large viewing area and high performance, while maintaining a low-cost, thin compact design.

Flat panel display devices, such as a liquid crystal display (LCD) and a plasma display panel (PDP) possessing these characteristics, are becoming more prevalent in the electronic display market. Recently, the OLED has attracted public attention because of its self-emitting characteristic. In particular, research and development has focused on mass-production and scale-up techniques for an active matrix OLED in which pixels arranged on an OLED panel are individually driven to obtain high-quality images.

A display device having an organic light-emitting layer uses an organic material element. As shown in FIG. 1, the initial luminance of the organic material element is abruptly reduced over time. Generally, the lifespan ($t_L$) of the organic material element ends when the luminance is less than a half luminance ($L_{1/2}$) of the initial luminance ($L_0$) of the organic material element. Hence, the lifespan of the organic material element shortens if the luminance of the organic material element is abruptly reduced at the initial stage of luminance.

In order to prevent shortening the organic material element's lifespan before a commercialization process, the OLED is subjected to an electrical processing during manufacture to extend the lifespan of the organic material element.

Through the electrical processing process, a current having a voltage greater than a driving voltage, which is applied to drive a display panel having the organic light-emitting layer, is supplied to the organic material element. Because many pixels are arranged on the display panel having the organic light-emitting layer, an excessive current may be supplied for the electrical processing of the OLED. When the excessive current is applied to a particular area of the OLED, the organic material element may overload. As a result, heat is generated in a particular area whose width is relatively narrow because of a resistance when the current flows, thereby causing the organic material element to become non-uniform, burn, or be damaged.

SUMMARY OF THE INVENTION

This invention provides an electrical processing apparatus and method for electrically processing a display panel having an organic light-emitting layer. The electrical processing is stably performed without locally burning or damaging an organic material element, resulting in a light-emitting region of the display panel having the organic light-emitting layer being virtually divided into a plurality of imaginary regions and a current for the electrical processing is individually supplied to each of the imaginary regions.

Additional features of the invention will be set forth in the description which follows, and in part will be apparent from the description, or may be learned by practice of the invention.

In order to achieve the above object, the present invention includes a method for electrically processing a display panel having an organic light-emitting layer including dividing a light-emitting region of the display panel into a plurality of regions; and applying a voltage to at least one region of the plurality of regions, wherein an amplitude of the voltage exceeds an amplitude of a driving voltage of the display panel.

The present invention also includes an apparatus for electrically processing a display panel including a display panel comprising an organic light-emitting layer, a light emitting region, and a plurality of regions, the plurality of regions being defined by dividing the light emitting region; a jig for holding the display panel; and a current supplying portion, wherein the current supplying portion supplies a current individually to each of the plurality of regions.

The present invention also includes a method for electrically processing a display panel including dividing a light-emitting region of the display panel into a plurality of regions, wherein two adjacent regions partially overlap each other; and applying a voltage to at least one region of the plurality of regions, wherein an amplitude of the voltage exceeds an amplitude of a driving voltage of the display panel.

The present invention also includes a flat panel display device including a display panel comprising a light-emitting region, wherein the light-emitting region is divided into a plurality of regions, the plurality of regions being individually supplied with an electrical current for an electrical processing.

The present invention also includes a flat panel display device including a display panel comprising a light-emitting region, the light-emitting region comprising a plurality of regions, wherein each of the plurality of regions is individually electrically processed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention are incorporated in and constitute a part of this specification, illustrate embodiments of the invention, and together with the description serve to explain the principles of the invention.

DETAILED DESCRIPTION OF THE INVENTION

Figure 1:
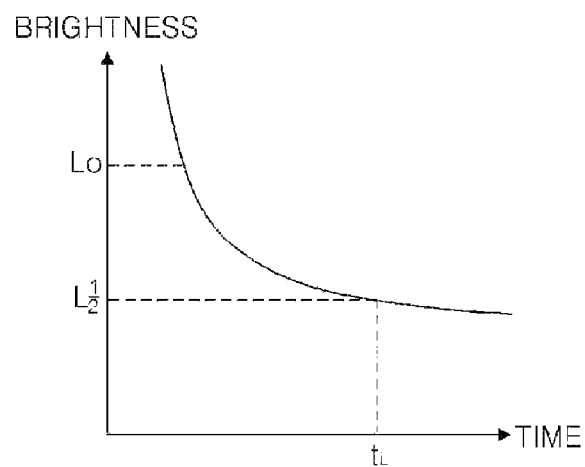
FIG. 1 is a graph showing a luminance characteristic of a conventional OLED over time.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative size of layers and regions may be exaggerated for clarity. Like reference numerals in the drawings denote like elements.

It will be understood that when an element such as a layer, film, region or substrate is referred to as being "on" or "connected to" another element or layer, it can be directly on, directly connected to, or directly coupled to the other element or layer, or intervening elements or layers may also be present. In contrast, when an element is referred to as being "directly on" or "directly connected to" another element or layer, there are no intervening elements or layers present.

Figure 2:
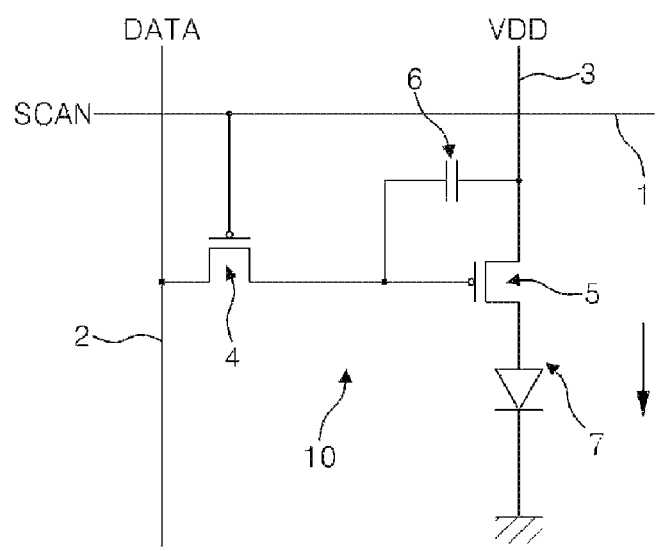
FIG. 2 is an equivalent circuit diagram showing a pixel of a conventional OLED.

FIG. 2 is an equivalent circuit diagram showing a pixel of a conventional OLED. Referring to FIG. 2, the conventional OLED includes pixels 10, which are connected to a gate line 1, a data line 2, and a common power line 3. Each pixel 10 includes a switching transistor 4, a driving transistor 5, a capacitor 6, and an organic electroluminescence (EL) element 7. Here, the switching transistor 4 and the driving transistor 5 are p-type thin film transistors (TFTs).

The switching transistor 4 is driven by a scan signal applied to the gate line 1 for switching a data signal applied to the data line 2. The driving transistor 5 determines the amount of current that flows through the organic EL element 7 by the data signal transferred through the switching transistor 4, i.e., a voltage difference between a gate and a source. The capacitor 6 maintains the voltage difference between the gate and the source of the driving transistor 5.

The display panel having an organic light-emitting layer includes a plurality of pixels 10 having the aforementioned structure, and each pixel is connected to a gate line and a data line. The pixels may be arranged in the form of a matrix.

The present invention provides an electrical processing apparatus and method for electrically processing the display panel in which a current with predetermined amplitude for the electrical processing may be applied to the pixel having the aforementioned structure to stabilize the organic EL element. Hence, the current for driving the pixel may be applied to the data line and the gate line to electrically process the organic EL element formed in each pixel connected to the data line and the gate line.

In an exemplary embodiment of the present invention, all pixels formed in the display panel having an organic light-emitting layer may not be subjected to a single electrical processing; however, the light emitting region of the display panel may be virtually divided into a plurality of imaginary regions, where the electrical processing may be individually performed for each imaginary region, thereby preventing the pixels from being damaged when current is applied to drive the pixels formed in the display panel and extending the lifespan of the device.

The light emitting region of the display panel is virtually divided into a plurality of imaginary regions, to define a region containing a predetermined number of gate lines or data lines exposed in an edge of the display panel, and to define a region of the display panel through which the gate lines or the data lines pass.

Consideration should be given when virtually dividing the light emitting region of the display panel into a plurality of imaginary regions. First, when each imaginary region is relatively large, the processing time for stabilizing the pixels may be relatively short because the number of imaginary regions is small. As the number of pixels in an area increases; however, the current required to drive the pixels also increases. Thus, when a large current is applied, each pixel may overload and be damaged.

In contrast, when each imaginary region is relatively small, the pixels can be stably processed because the amplitude of the current applied to each pixel is small. However, the processing time for stabilizing the pixels may be lengthy because the number of imaginary regions to be electrically processed is increased.

For the foregoing reasons, the light emitting region may be divided into a plurality of imaginary regions where the size of each imaginary region is maximized to the extent that the amplitude of the current applied to each imaginary region does not damage the pixels within that imaginary region.

In this specification, two exemplary methods for electrically processing the display panel having the light-emitting region divided into a plurality of imaginary regions according to exemplary embodiments of the present invention are introduced.

Figure 3:
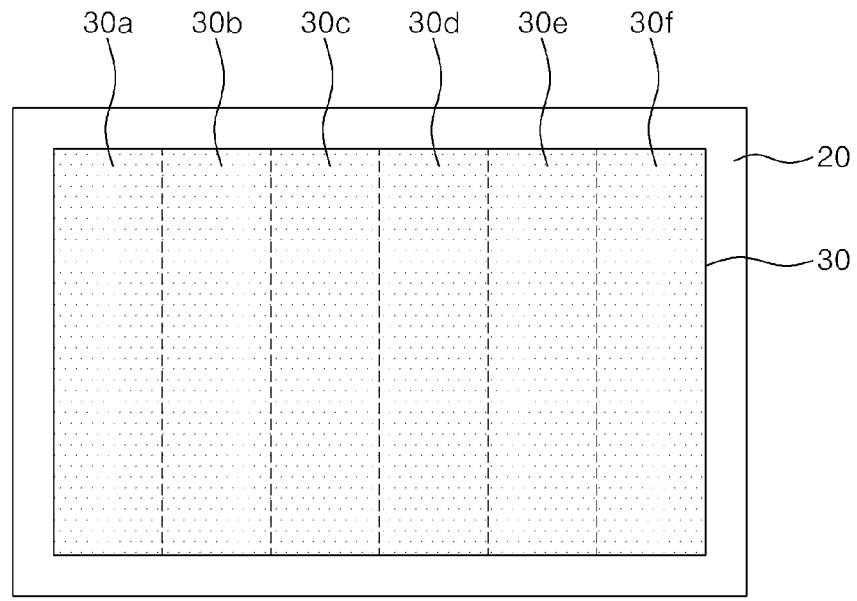
FIG. 3 is a plan view showing a method for dividing a light-emitting region of a display panel having an organic light-emitting layer into a plurality of regions according to a first exemplary embodiment of the present invention.

FIG. 3 is a plan view showing a method for dividing a light-emitting region of a display panel having an organic light-emitting layer into a plurality of imaginary regions according to a first exemplary embodiment of the present invention.

As shown in FIG. 3, a light-emitting region 30 of a display panel 20 having a light-emitting layer is virtually divided into a plurality of imaginary regions 30a, 30b, 30c, 30d, 30e, and 30f. Each imaginary region 30a, 30b, 30c, 30d, 30e, and 30f has the same size. Current may be independently applied to each imaginary region.

There may be various methods for applying the current to the imaginary regions.

For example, after virtually dividing the display panel into imaginary regions 30a, 30b, 30c, 30d, 30e, and 30f, the current may be simultaneously applied to all imaginary regions. In this instance, all the imaginary regions 30a, 30b, 30c, 30d, 30e, and 30f are simultaneously subjected to the electrical processing, preventing an excessive amount of current through the light-emitting region 30, shortening the processing time to stabilize each pixel, and extending the lifespan of the display panel.

Alternatively, after virtually dividing the display panel into the imaginary regions 30a, 30b, 30c, 30d, 30e, and 30f, the electrical processing may be performed by sequentially applying the current to the imaginary regions 30a, 30b, 30c, 30d, 30e, and 30f from one side of the light-emitting region to the other. Hence, imaginary region 30a is electrically processed first followed by electrically processing imaginary region 30b through imaginary region 30f or vice versa.

While the organic EL element is driven, a current caused by a voltage of about 7 volts to about 10 volts may be applied to the driving transistor. For the electrical processing of the display panel according to the first exemplary embodiment of the present invention, a current caused by a higher voltage that is greater than the driving voltage, may be applied to the driving transistor. The higher voltage may be about 20 volts to about 30 volts. Applying a higher voltage may stabilize the organic EL element, thereby extending the lifespan of the display device.

The amount or amplitude of current applied to each imaginary region 30a, 30b, 30c, 30d, 30e, or 30f for the electrical processing is less than the total amount or amplitude of current required for driving all elements arranged in the display panel having the organic light-emitting layer. This is possible because the display panel having the organic light-emitting layer is divided into a plurality of imaginary regions 30a, 30b, 30c, 30d, 30e, and 30f and each imaginary region 30a, 30b, 30c, 30d, 30e, and 30f is individually subjected to the electrical processing.

Here, the current applied to each pixel for the electrical processing may be direct current (DC) or alternating current (AC) having a predetermined pulse.

The electrical processing performed while applying the current with predetermined amplitude electrically processes a predetermined imaginary region 30a, 30b, 30c, 30d, 30e, or 30f, generating heat only in the imaginary region 30a, 30b, 30c, 30d, 30e, or 30f where the electrical processing is being performed. The locally generated heat gives a heat effect to the imaginary region 30a, 30b, 30c, 30d, 30e, or 30f where the electrical processing is being performed; thus, uniform processing of the light-emitting region 30 may be difficult. Accordingly, it is important to quickly dissipate or spread out the heat to neighboring imaginary regions 30a, 30b, 30c, 30d, 30e, and 30f.

During the electrical processing of each imaginary region 30a, 30b, 30c, 30d, 30e, and 30f, the entire display panel having the organic light-emitting layer may be cooled. Alternatively, the cooling process may be performed for each imaginary region 30a, 30b, 30c, 30d, 30e, and 30f. For example, when the electrical processing for each imaginary region 30a, 30b, 30c, 30d, 30e, and 30f may be sequentially performed from side to side as described above, the cooling process is sequentially performed for each imaginary region 30a, 30b, 30c, 30d, 30e, and 30f from side to side. When the cooling process is performed only for the imaginary region 30a, 30b, 30c, 30d, 30e, or 30f being electrically processed, the energy required for the cooling process is reduced and the electrical processing is performed under more consistent process conditions.

Figure 4:
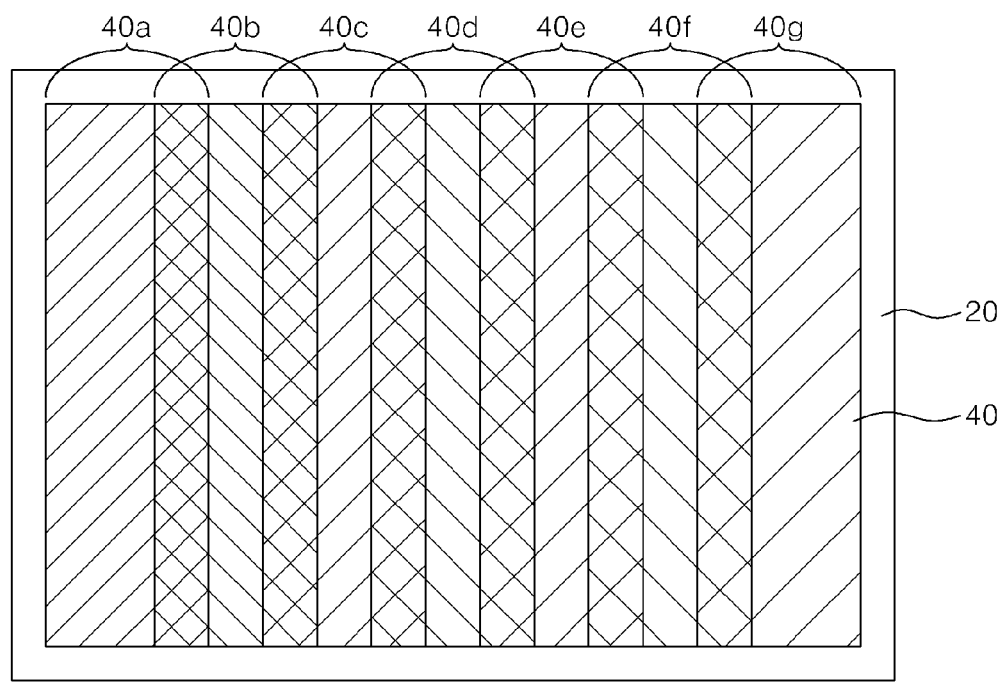
FIG. 4 is a plan view showing a method for dividing a light-emitting region of a display panel having an organic light-emitting layer into a plurality of regions according to a second exemplary embodiment of the present invention.

FIG. 4 is a plan view showing a method for dividing a light-emitting region of a display panel having an organic light-emitting layer into a plurality of imaginary regions according to a second exemplary embodiment of the present invention.

In the first exemplary embodiment described above, each imaginary region 30a, 30b, 30c, 30d, 30e, and 30f is independently subjected to the electrical processing. In this instance, a boundary line is formed between two neighboring imaginary regions 30a, 30b, 30c, 30d, 30e, and 30f. Each imaginary region 30a, 30b, 30c, 30d, 30e, and 30f may not be uniformly processed because it may be difficult to perform the electrical processing under the same conditions for each imaginary region.

If each imaginary region 30a, 30b, 30c, 30d, 30e, and 30f is not uniformly processed, a luminance difference may occur between the imaginary regions 30a, 30b, 30c, 30d, 30e, and 30f, and the luminance difference becomes clearer in the boundary between the imaginary regions. The luminance difference may result in a defective display device.

In order to solve such problems, in the second exemplary embodiment of the present invention, a light-emitting region 40 of the display panel 20 is virtually divided into a plurality of imaginary regions 40a, 40b, 40c, 40d, 40e, 40f, and 40g, where a portion of each imaginary region 40a, 40b, 40c, 40d, 40e, 40f, and 40g overlaps a portion of a neighboring imaginary region, as shown in FIG. 4. For example, when the imaginary region 40a or 40g is defined, the next imaginary region 40b or 40f, respectively, is defined to overlap a portion of the already defined imaginary region 40a or 40g. Additionally, when the imaginary regions 40b, 40c, 40d, 40e, or 40f are defined, adjacent imaginary regions are defined to overlap a portion on either side of these regions.

In the second exemplary embodiment in which the imaginary regions 40a, 40b, 40c, 40d, 40e, 40f, and 40g are defined to overlap at least one adjacent imaginary region 40a, 40b, 40c, 40d, 40e, 40f, or 40g, the electrical processing is performed by a method different from the first exemplary embodiment. In the first exemplary embodiment, each imaginary region 30a, 30b, 30c, 30d, 30e, and 30f is independent, and the electrical processing can be simultaneously performed for all the imaginary regions 30a, 30b, 30c, 30d, 30e, and 30f. However, in the second exemplary embodiment the imaginary regions 40a, 40b, 40c, 40d, 40e, 40f, and 40g partially overlap at least one adjacent imaginary region 40a, 40b, 40c, 40d, 40e, 40f, or 40g, and the electrical processing can not be simultaneously performed for two or more overlapping imaginary regions 40a, 40b, 40c, 40d, 40e, 40f, and 40g. Accordingly, the electrical processing for a corresponding imaginary region 40a, 40b, 40c, 40d, 40e, 40f, or 40g should be completed before the electrical processing for the next imaginary region 40a, 40b, 40c, 40d, 40e, 40f, or 40g is performed.

Additionally, when the electrical processing is performed for the overlapped imaginary regions as in the second exemplary embodiment of the present invention, the data lines or the gate lines arranged in each imaginary region 40a, 40b, 40c, 40d, 40e, 40f, or 40g should be accurately selected. For example, among a plurality of data lines or gate lines arranged in one imaginary region 40a, 40b, 40c, 40d, 40e, 40f, or 40g, the data lines or gate lines arranged in the non-overlapped portion are not driven during the electrical processing of the neighboring imaginary region 40a, 40b, 40c, 40d, 40e, 40f, or 40g, but the data lines or gate lines arranged in the overlapped portion are driven during the electrical processing of the neighboring imaginary region 40a, 40b, 40c, 40d, 40e, 40f, or 40g. Accordingly, a plurality of data lines or gates lines arranged in one imaginary region 40a, 40b, 40c, 40d, 40e, 40f, or 40g should be individually driven.

The electrical processing according to the second exemplary embodiment of the present invention may be difficult to perform when it is difficult to individually drive the data lines or gate lines arranged in the display panel. That is, the electrical processing of the second exemplary embodiment of the present invention may be performed with a driving module having a tape carrier packaging (TCP) and a printed circuit board (PCB) mounted in the driving module.

In the second exemplary embodiment of the present invention, other processing conditions, such as amplitude of the current, amplitude of the voltage, and the processing time to stabilize the pixels is substantially similar to the processing conditions described for the first exemplary embodiment of the present invention.

An electrical processing apparatus for electrically processing the display panel having the organic light-emitting layer according to an exemplary embodiment of the present invention are explained below with reference to FIG. 5 and FIG. 6.

Figure 5:
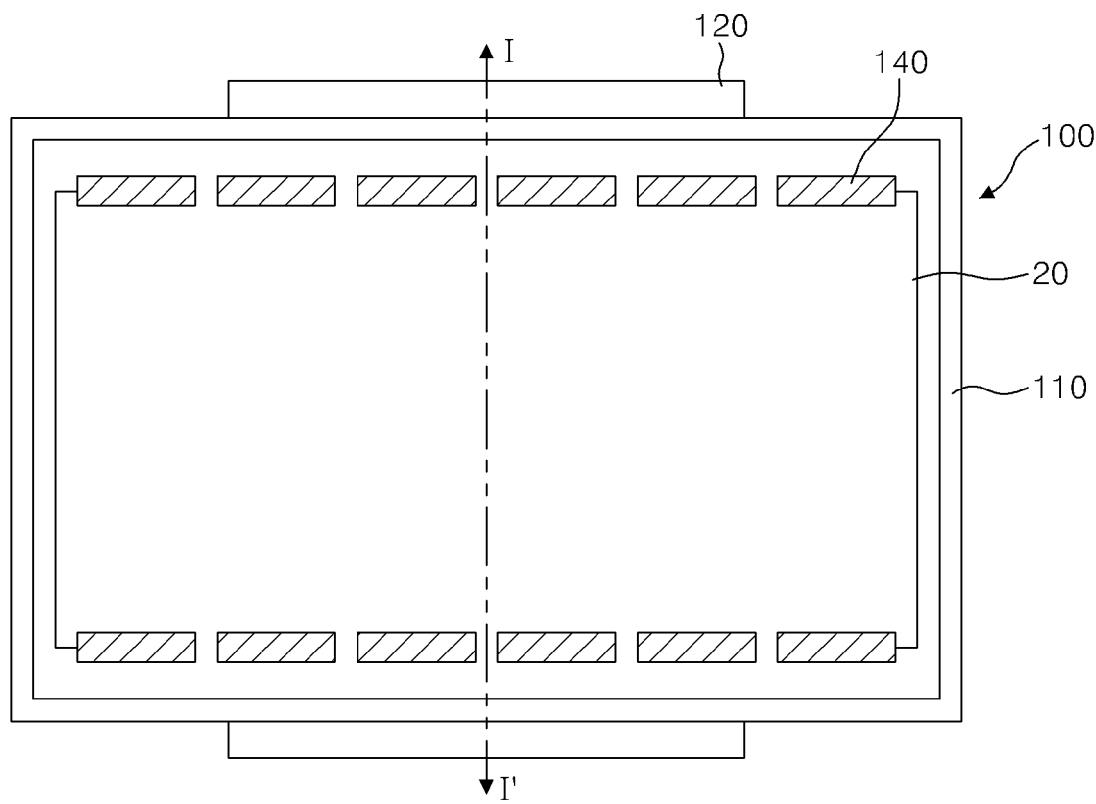
FIG. 5 is a plan view showing an electrical processing apparatus for electrically processing the display panel having the organic light-emitting layer according to an exemplary embodiment of the present invention.
Figure 6:
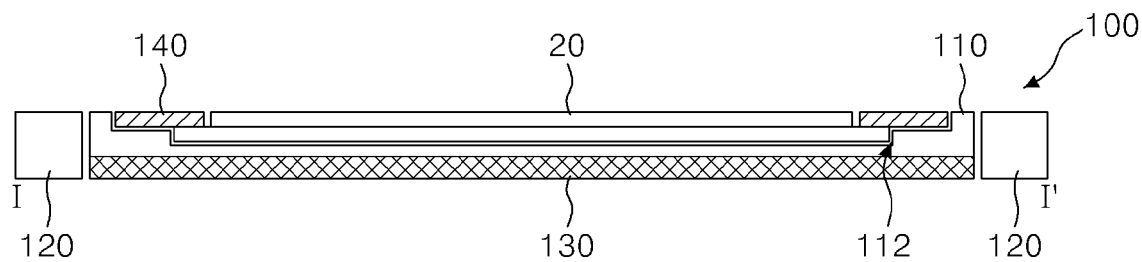
FIG. 6 is a cross-sectional view taken along line I-I' of FIG. 5 for showing an electrical processing apparatus for electrically processing the display panel having the organic light-emitting layer according to an exemplary embodiment of the present invention.

FIG. 5 and FIG. 6 are a plan view and a cross-sectional view taken along line I-I' of FIG. 5, respectively, for showing an electrical processing apparatus for electrically processing the display panel having the organic light-emitting layer according to an exemplary embodiment of the present invention.

The electrical processing apparatus 100 for electrically processing the display panel 20 having the organic light-emitting layer includes a jig 110 and a current supplying portion 120. The jig 110 may be a working plate on which the display panel 20 having the organic light-emitting layer is placed for the electrical processing. The jig 110 allows the current to be applied to a certain region of the display panel 20 having the organic light-emitting layer.

A special structure for the jig 110 is not needed. The jig 110 may have a flat plate structure on which the display panel may be stably placed. As shown in FIG. 6, the jig 110 has a groove 112, similar in size to the display panel 20, so that the display panel 20 may be placed on the jig 110 without requiring a process for aligning the display panel 20.

The current supplying portion 120 is arranged at an edge of the jig 110 to supply current independently to each imaginary region 30a to 30f or 40a to 40g defined on the display panel 20 having the organic light-emitting layer. The current supplying portion 120 may be connected to the data line or the gate line exposed at the edge of the display panel 20 to supply the current needed for the electrical processing.

A contact pad 140 may be further arranged to contact the plurality of data lines or gate lines exposed at the edge of the display panel 20 having the organic light-emitting layer. The contact pad 140 may include a structure to connect the contact pad 140 to the current supplying portion 120, allowing the contact pad 140 to contact all the data lines or gate lines corresponding to the imaginary regions 30a to 30f or 40a to 40g defined in the light-emitting region 30 or 40 of the display panel 20. For example, the contact pad 140 may have a similar structure to a probe used for testing the organic material element after completing the electrical processing method.

However, when the display panel 20 having the organic light-emitting layer has a contact portion connected to the data lines or gate lines of a predetermined imaginary region 30a to 30f or 40a to 40g for electrical processing, the contact pad 140 may not need to be provided. In manufacturing the display panel, the contact portion of the display panel 20 is preferably formed after the organic material element, and then removed and discarded after the electrical processing is performed.

The processing conditions, such as the amplitude of the current, the amplitude of the voltage, and the processing time to stabilize the pixels are substantially similar to the processing conditions for the first exemplary embodiment of the present invention.

The electrical processing apparatus 100 may further comprise a cooling portion 130 to cool the display panel 20. The cooling portion 130 may be arranged below the jig 110 and cools the display panel 20 to maintain a specific cooling temperature for the electrical processing.

The electrical processing apparatus according to the exemplary embodiment of the present invention may further include a chamber in which a plurality of jigs are arranged. The electrical processing apparatus with this chamber may prevent the display panel 20 from being contaminated during the display's lifespan extending process, maintaining the display panel 20 a cooler temperature during the electrical processing, thereby maximizing process conditions.

As described above, according to the electrical processing apparatus and method for electrically processing the display panel having the organic light-emitting layer of the present invention, the light-emitting region of the display panel having an organic light-emitting layer is virtually divided into a plurality of imaginary regions. Electrical processing is individually performed on each imaginary region, where the amplitude of the current applied to one imaginary region during the electrical processing is determined so that it prevents damage to the organic material element.

Suitable for electrically processing large-sized OLEDs, the electrical processing apparatus and method according to the present invention may be useful in the mass production of large-sized OLEDs.

Although exemplary embodiments of the present invention have been described in detail hereinabove, it should be clearly understood that many variations and/or modifications of the basic inventive concepts taught herein, which may appear to those skilled in the present art, will still fall within the spirit and scope of the present invention. Thus, it is intended that the present invention cover the modifications and variations of this invention provided they come within the scope of the appended claims and their equivalents.

What is claimed is:

1. A method for electrically processing a display panel comprising organic EL elements, the method comprising:
   dividing a light-emitting region of the display panel into a plurality of regions; and
   applying a predetermined voltage to organic EL elements disposed in at least one region of the plurality of regions among the organic EL elements,
   wherein an amplitude of the predetermined voltage exceeds an amplitude of a maximum voltage of voltages applied to the organic EL elements when the display panel is driven to display an image.

2. The method of claim 1, wherein an amplitude of a current applied to the display panel is less than an amplitude of a current for driving all elements formed in the display panel.

3. The method of claim 2, wherein the predetermined voltage is in the range of about 20 volts to about 30 volts.

4. The method of claim 1, wherein the electrical processing is sequentially performed in a direction from a region on one side of the display panel to another region on the other side of the display panel.

5. The method of claim 1, further comprising cooling the display panel.

6. A method for electrically processing a display panel comprising organic EL elements, the method comprising:
   dividing a light-emitting region of the display panel into a plurality of regions, wherein two adjacent regions partially overlap each other; and
   applying a predetermined voltage to organic EL elements disposed in at least one region of the plurality of regions among the organic EL elements,
   wherein an amplitude of the predetermined voltage exceeds an amplitude of a maximum voltage of voltages applied to the organic EL elements when the display panel is driven to display an image.

7. The method of claim 6, wherein an amplitude of a current applied to the display panel is less than an amplitude of a current for driving all elements formed in the display panel.

8. The method of claim 6, wherein the predetermined voltage is in the range of about 20 volts to about 30 volts.

9. The method of claim 6, wherein the electrical processing is sequentially performed in a direction from a region on one side of the display panel to another region on the other side of the display panel.

10. The method of claim 6, further comprising cooling the display panel.

11. A method for electrically processing a display panel comprising organic EL elements, the method comprising:
dividing pixels of a light-emitting region into groups of pixels; and
applying a predetermined voltage to organic EL elements disposed in at least one group of pixels of the group of pixels among the organic EL elements,
wherein an amplitude of the predetermined voltage exceeds an amplitude of a maximum voltage of voltages applied to the organic EL elements when the display panel is driven to display an image.

12. The method of claim 11, wherein applying the predetermined voltage is simultaneously performed for all the group of pixels.

13. The method of claim 11, wherein applying the predetermined voltage is sequentially performed from one group of pixels to another group of pixels.

14. The method of claim 11, wherein two adjacent neighboring group of pixels partially overlap each other.

* * * * *